United States Patent
Cutilli et al.

(10) Patent No.: US 9,791,849 B2
(45) Date of Patent: Oct. 17, 2017

(54) DEFECT DETECTION PROCESS IN A SEMICONDUCTOR MANUFACTURING ENVIRONMENT

(71) Applicant: GLOBALFOUNDRIES Inc., Grand Cayman (KY)

(72) Inventors: David F. Cutilli, Pleasant Valley, NY (US); Matthew J. Hartnett, Beacon, NY (US); Keith A. Robishaw, Clinton Corners, NY (US); Glenn M. Stefanski, Fishkill, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 335 days.

(21) Appl. No.: 14/722,074

(22) Filed: May 26, 2015

(65) Prior Publication Data

US 2016/0349735 A1    Dec. 1, 2016

(51) Int. Cl.
*H01L 21/67*         (2006.01)
*G05B 19/4063*    (2006.01)
*G05B 15/02*         (2006.01)

(52) U.S. Cl.
CPC ......... *G05B 19/4063* (2013.01); *G05B 15/02* (2013.01); *H01L 21/67288* (2013.01); *G05B 2219/32222* (2013.01)

(58) Field of Classification Search
CPC ................ G05B 19/4063; G05B 15/02; G05B 2219/32222; H01L 21/67288; H01L 22/30; H01L 22/20
USPC ........................................................ 414/805
See application file for complete search history.

(56) References Cited

U.S. PATENT DOCUMENTS

| | | | |
|---|---|---|---|
| 6,928,892 B2 | 8/2005 | Storbeck et al. | |
| 8,170,707 B2 * | 5/2012 | Matsushita | G05B 19/41875 700/110 |
| 8,328,950 B2 | 12/2012 | Baseman et al. | |

(Continued)

OTHER PUBLICATIONS

Entegris Spectra FOUP, [online]. Entegris, Inc., [retrieved on Apr. 22, 2015]. Retrieved from the Internet: <URL: https://www.entegris.com/resources/assets/1320-2413-1012.pdf>, all pages.

*Primary Examiner* — Kaitlin Joerger
(74) *Attorney, Agent, or Firm* — Heslin Rothenberg Farley & Mesiti, P.C.; George S. Blasiak, Esq.

(57) ABSTRACT

A process for detecting foreign particle defects and scratch defects on semiconductor products including detecting foreign particle and scratch defects on the semiconductor products; placing the semiconductor products in a first wafer carrier and docking to a first load port of a semiconductor processing tool; opening a door of the first wafer carrier; transferring the semiconductor products from the first wafer carrier through the first load port to and through an interior of the semiconductor processing tool to a second load port of the semiconductor processing tool; transferring the semiconductor products from the second load port to a second wafer carrier; closing a door of the second wafer carrier and undocking from the second load port; and detecting foreign particle and scratch defects on the semiconductor products and comparing to the foreign particle defects on the semiconductor products prior to placing the semiconductor products in the first wafer carrier.

18 Claims, 4 Drawing Sheets

(56) References Cited

U.S. PATENT DOCUMENTS

| | | | |
|---|---|---|---|
| 8,616,821 B2* | 12/2013 | Ku | H01L 21/67201 |
| | | | 414/217 |
| 9,455,166 B2* | 9/2016 | Kondoh | H01L 21/67259 |
| 2002/0015636 A1 | 2/2002 | Lee et al. | |
| 2004/0117055 A1 | 6/2004 | Seidel et al. | |
| 2015/0340258 A1* | 11/2015 | Hiyashi | H01L 21/67288 |
| | | | 414/416.03 |
| 2015/0340259 A1* | 11/2015 | Wakabayashi | H01L 21/67772 |
| | | | 414/222.01 |
| 2016/0111310 A1* | 4/2016 | Koike | H01L 21/67784 |
| | | | 414/217 |

* cited by examiner

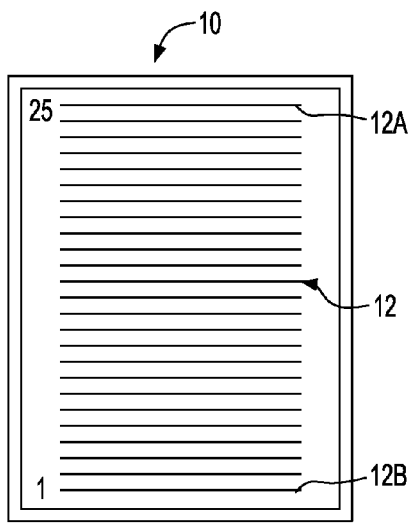
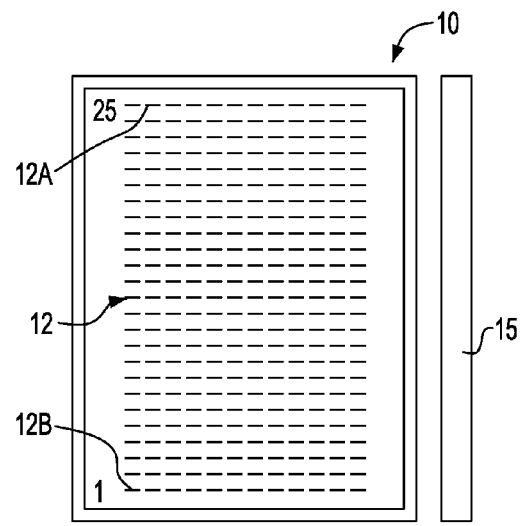
FIG. 1A  FIG. 1B
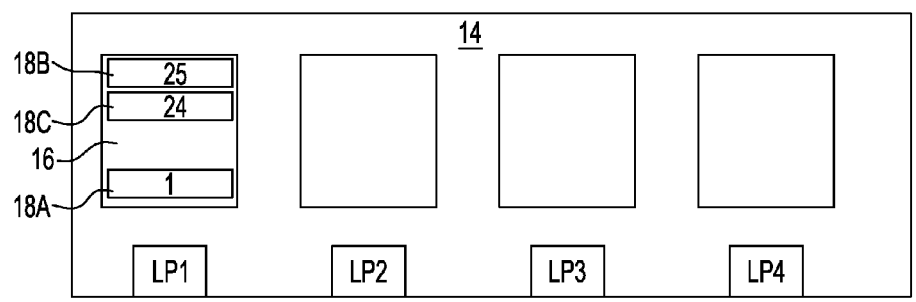
FIG. 2

DEFECT DETECTION PROCESS IN A SEMICONDUCTOR MANUFACTURING ENVIRONMENT

BACKGROUND

The present invention relates to a process for detecting foreign particle and scratch defects on semiconductor products processed through a semiconductor manufacturing processing tool.

In semiconductor manufacturing, contamination, for example by particles or foreign substances, and scratches constitutes a great risk with the consequences of reducing the quality and total failure of the electronic components. For this reason, the environmental conditions during semiconductor fabrication are kept at the highest possible quality level by filters and by monitoring the physical conditions in the room. That is, the number of contaminating particles per volume element is kept as low as possible.

In order to meet the requirements on structure widths which decrease to an ever increasing extent, much better clean conditions, as compared with the clean room condition, are created by using mini environments to transport the semiconductor products (for example, semiconductor wafers, masks or flat panel displays) to and from the manufacturing tools. As compared with the surrounding clean room, the air in the mini environments has a much lower number of contaminating particles per volume. The mini environments may also be called wafer carriers, substrate transports or substrate transfer carriers, hereafter collectively referred to as wafer carriers.

Unfortunately, all moveable parts and components produce contamination, even during fault-free operation. The handling systems of the manufacturing tools for semiconductor products can produce unacceptable contamination if maladjustments of the handling systems arise, for example, when semiconductor products being loaded or unloaded in a wafer carrier are scraped as a result of an inaccurate adjustment; in the process, layers on the semiconductor product or in/on the wafer carrier flake off and become a contamination source. The particles flaked off can be deposited on the same semiconductor product or on the semiconductor products which follow or are located underneath and can lead to yield losses in the latter.

In particular, wafer carriers may themselves constitute a serious contamination source. Typically, such wafer carriers are used during the deposition of layers on semiconductor products. Therefore, not only are the semiconductor products but also the wafer carriers may be coated with the material respectively deposited.

Since the wafer carriers may be neither cleaned immediately nor replaced following processing of semiconductor products in a manufacturing tool, contaminants may accumulate in the course of processing semiconductor products through several tools. Accordingly, foreign particle defects due to contamination in the manufacturing tools or the wafer carriers may remain undetected for an undesirably long time.

BRIEF SUMMARY

The various advantages and purposes of the exemplary embodiments as described above and hereafter are achieved by providing, according to a first aspect of the exemplary embodiments, a process for detecting foreign particle defects and scratch defects on a plurality of semiconductor products comprising:

detecting foreign particle and scratch defects on the plurality of semiconductor products;
placing the plurality of semiconductor products in a first wafer carrier;
docking the first wafer carrier to a first load port of a multi-port semiconductor processing tool;
opening a door of the first wafer carrier;
transferring the plurality of semiconductor products from the first wafer carrier through the first load port to an interior of the multi-port semiconductor processing tool;
moving the semiconductor products through the interior of the multi-port processing tool without performing a processing operation on the semiconductor products that alters the semiconductor products to a second load port of the multi-port semiconductor processing tool;
transferring the plurality of semiconductor products from the second load port to a second wafer carrier;
closing a door of the second wafer carrier;
undocking the second wafer carrier from the second load port; and
detecting foreign particle and scratch defects on the semiconductor products and comparing to the foreign particle defects on the semiconductor products prior to placing the plurality of semiconductor products in the first wafer carrier.

According to a second aspect of the exemplary embodiments, there is provided a process for detecting foreign particle and scratch defects on a plurality of semiconductor products comprising:

(a) detecting foreign particle and scratch defects on the plurality of semiconductor products;
(b) transferring the plurality of semiconductor products to a wafer carrier;
(c) docking the wafer carrier to a load port of a multi-port semiconductor processing tool;
(d) opening a door of the wafer carrier;
(e) transferring the plurality of semiconductor products from the wafer carrier through the load port to an interior of the multi-port semiconductor processing tool;
(f) moving the semiconductor products through the interior of the multi-port processing tool without performing a processing operation on the semiconductor products that alters the semiconductor products to another load port of the multi-port semiconductor processing tool;
(g) transferring the plurality of semiconductor products from the another load port to another wafer carrier;
(h) closing a door of the another wafer carrier;
(i) undocking the another wafer carrier from the another load port;
(j) docking the another wafer carrier to the another load;
(k) repeating the processes of (e) to (j) until the semiconductor products have been moved to any remaining load ports of the multi-port semiconductor processing tool and transferred to an remaining wafer carriers corresponding to the remaining load ports; and
(l) detecting foreign particle and scratch defects on the semiconductor products and comparing to the foreign particle defects on the semiconductor products prior to placing the plurality of semiconductor products in the first wafer carrier.

According to a third aspect of the exemplary embodiments, there is provided a computer program product for detecting foreign particle and scratch defects on a plurality of semiconductor products, the computer program product comprising:
a computer readable storage medium having computer readable program code embodied therewith, the computer readable program code comprising:
(a) computer readable program code configured to detect foreign particle and scratch defects on the plurality of semiconductor products;
(b) computer readable program code configured to transfer the plurality of semiconductor products to a wafer carrier;
(c) computer readable program code configured to dock the wafer carrier to a load port of a multi-port semiconductor processing tool;
(d) computer readable program code configured to open a door of the wafer carrier;
(e) computer readable program code configured to transfer the plurality of semiconductor products from the wafer carrier through the load port to an interior of the multi-port semiconductor processing tool;
(f) computer readable program code configured to move the semiconductor products through the interior of the multi-port processing tool without performing a processing operation on the semiconductor products that alters the semiconductor products to another load port of the multi-port semiconductor processing tool;
(g) computer readable program code configured to transfer the plurality of semiconductor products from the another load port to another wafer carrier;
(h) computer readable program code configured to close a door of the another wafer carrier;
(i) computer readable program code configured to undock the another wafer carrier from the another load port;
(j) computer readable program code configured to dock the another wafer carrier to the another load;
(k) computer readable program code configured to repeat the processes of (e) to (j) until the semiconductor products have been moved to any remaining load ports of the multi-port semiconductor processing tool and transferred to an remaining wafer carriers corresponding to the remaining load ports; and
(l) computer readable program code configured to detect foreign particle and scratch defects on the semiconductor products and compare to the foreign particle defects on the semiconductor products prior to placing the plurality of semiconductor products in the first wafer carrier.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 1A is front view of a wafer carrier with the door removed and FIG. 1B is a side view of the wafer carrier of FIG. 1A showing the door in the removed position.

FIGS. 2 to 6 illustrate a method of the exemplary embodiments for testing for foreign particle and scratch defects due to the movement of semiconductor products from wafer carriers into a semiconductor processing tool, through the semiconductor processing tool and into other wafer carriers wherein:

FIG. 2 illustrates three semiconductor products in a wafer carrier at a first load port of a four-load port semiconductor processing tool;

FIG. 3 illustrates the movement of the semiconductor products into the semiconductor processing tool through the first load port, through the semiconductor processing tool to a fourth load port and into a second wafer carrier;

FIG. 4 illustrates the movement of the semiconductor products into the semiconductor processing tool through the fourth load port, through the semiconductor processing tool to a second load port and into a third wafer carrier;

FIG. 5 illustrates the movement of the semiconductor products into the semiconductor processing tool through the second load port, through the semiconductor processing tool to a third load port and into a third wafer carrier; and FIG. 6 illustrates the movement of the semiconductor products into the semiconductor processing tool through the third load port, through the semiconductor processing tool to the first load port and into the first wafer carrier.

DETAILED DESCRIPTION

Figure 3:
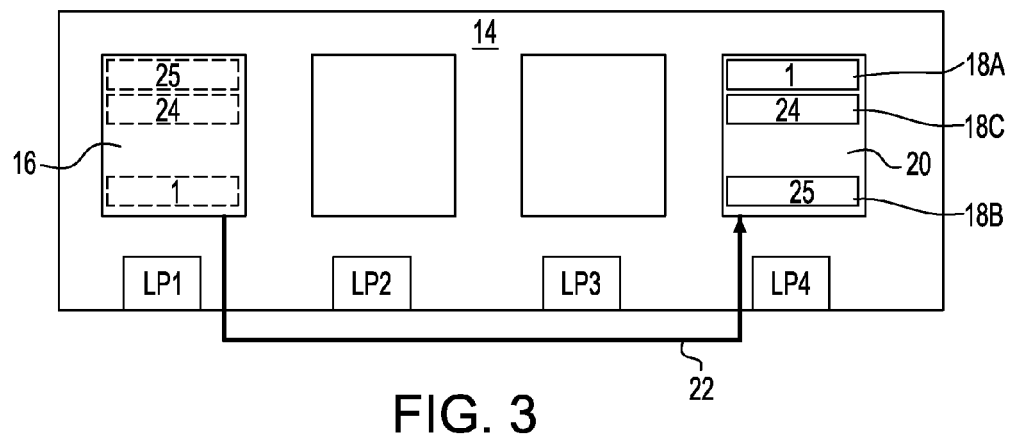

Referring to the Figures in more detail, and particularly referring to FIGS. 1A and 1B, there is shown a wafer carrier 10. The wafer carrier 10 has space for a certain number of semiconductor products 12. In the wafer carrier 10 shown in FIGS. 1A and 1B, there are spaces for 25 semiconductor products 12 such as semiconductor wafers. A typical wafer carrier 10 may have 25 spaces or 13 spaces and the exemplary embodiments are applicable to these wafer carriers as well as future wafer carriers that may be used in which the spaces for semiconductor products may vary from 25 spaces or 13 spaces. Not shown in FIG. 1 are the shelves that support each of the semiconductor products 12. The top semiconductor product 12A may be on the 25$^{th}$ numbered shelf and is indicated by the number 25 while the bottom semiconductor product 12B may be on the first numbered shelf and is indicated by the number 1. Not shown in FIG. 1A is a door to the wafer carrier 10, either on the front or the bottom of the wafer carrier 10, that may be opened to remove the semiconductor products 12 from the wafer carrier 10. FIG. 1B shows a door 15 for a wafer carrier 10. In operation, the door 15 is typically separated from the body of the wafer carrier 10 to allow the semiconductor products 12 to be transported from the wafer carrier into the semiconductor processing tool.

In operation, a wafer carrier 10 may be positioned with respect to a load port of a semiconductor processing tool. When the processing of the semiconductor products 12 in the wafer carrier 10 is called for by the semiconductor processing tool, the door 15 of the wafer carrier 10 is opened at a load port, one or more of the semiconductor products 12 may be moved into the semiconductor processing tool through the load port, the one or more of the semiconductor products 12 may be processed by the semiconductor processing tool, and then the one or more of the semiconductor products processed by the semiconductor processing tool may be moved through the load port back into the wafer carrier 10 that originally carried the one or more semiconductor products or, more typically, into a different wafer carrier 10. The door 15 to the wafer carrier 10 may then be closed, the wafer carrier 10 removed from the load port and transported to another tool for further processing.

While the exemplary embodiments pertain to wafer carriers in general, a most preferred exemplary embodiment of a wafer carrier is a so-called FOUP (front opening unified pod). A FOUP is a particular kind of wafer carrier 10 which has a front opening door 15 that may be opened by the load port. FOUPs may be the standard wafer carrier in a semiconductor wafer manufacturing fabrication facility.

The present inventors have found that contamination of semiconductor products 12 may occur from different sources. Contamination may occur from opening of the wafer carrier door 15, transporting of the semiconductor products 12 from the wafer carrier 10 into the semiconductor processing tool, transporting of the semiconductor products through the semiconductor processing tool, transporting of the semiconductor products 12 back into the wafer carrier 10 and then closing of the wafer carrier door 15. Processing of the semiconductor products 12 in the semiconductor processing tool may be an additional source of contamination but the preferred exemplary embodiments are concerned with testing for contamination from transportation sources and are not concerned with processing contamination.

The contamination sources may be characterized as coming from "X", "Y" and "Z" directions. That is, "X" contamination sources may be from opening of the wafer carrier door, transporting of the semiconductor products 12 from the wafer carrier 10 into the semiconductor processing tool, transporting of the semiconductor products 12 back into the wafer carrier 10 and then closing of the wafer carrier door. "Y" contamination sources may be from transporting of the semiconductor products 12 through the semiconductor processing tool. "Z" contamination sources may be from movement of the semiconductor products 12 from a low position (such as the first numbered shelf) to a higher position (such as the $25^{th}$ numbered shelf) in the wafer carrier 10.

Accordingly, the present inventors have proposed exemplary embodiments to detect contamination of semiconductor products from the sources indicated above. In the exemplary embodiments, the possibilities for contamination from the X, Y and Z sources of contamination may be maximized in order to provide the best solution for detection of contaminants. The preferred exemplary embodiments may use the full range of motions into, out of and through the semiconductor processing tool to detect foreign particle contaminants.

Referring now to FIGS. 2 to 6, there is described a method of the exemplary embodiments. In FIG. 2, there is illustrated a semiconductor processing tool 14 having four load ports, LP1, LP2, LP3 and LP4. Four load ports may be typical in semiconductor processing tools although there may be semiconductor processing tools that may have more or less than four load ports. Older semiconductor processing tools may have less than four load ports while newer semiconductor processing tools may have more than four load ports. Four load ports have been used as an example for the purpose of describing the exemplary embodiments and the exemplary embodiments have applicability to the older semiconductor processing tools as well as the newer semiconductor processing tools. An important concept of the exemplary embodiments is to transport the semiconductor products 12 the maximum amount of distance as possible in the X, Y and Z directions as described above through at least two of the load ports using at least two wafer carriers.

Not shown in FIG. 2, three semiconductor products 18, semiconductor wafers for example, may be scanned by a conventional process to measure any contaminants (including scratches) on the semiconductor products 18. This measure constitutes the initial contaminant measurement. The semiconductor products 18 may be blank semiconductor products or may have some patterns formed on them. The semiconductor products 18 are placed in a wafer carrier 16 which has been cleaned to substantially remove any contaminants. The wafer carrier 16 may have, for example, 25 shelves for receiving the semiconductor products 18. The wafer carrier 16 may be similar to wafer carrier 10 shown in FIG. 1. It is preferred that one of the semiconductor products 18A be placed on a lower shelf of the wafer carrier 16, one of the semiconductor products 18B be placed on an upper shelf of the wafer carrier 16 and another one of the semiconductor products 18C be placed between the lower shelf and the upper shelf.

Referring back to FIG. 2, wafer carrier 16 is shown docked at LP1 of the semiconductor processing tool 14. Semiconductor product 18A is on the first shelf of the wafer carrier 16 while semiconductor product 18B is on the $25^{th}$ or top shelf of the wafer carrier 14. Semiconductor product 18C is on a shelf between the first and $25^{th}$ shelves but is preferably on the $24^{th}$ shelf. There are several reasons for this preferred arrangement of the semiconductor wafers 18. The first reason is that there is maximum range of "Z" motion when the positions of the semiconductor products 18A, 18B are exchanged as explained hereafter.

The second reason is that semiconductor product 18C should be on the $24^{th}$ shelf just below the top shelf of the wafer carrier 16 so as to catch any contaminants that may fall from the semiconductor product 18 on the top shelf, semiconductor product 18B as shown in FIG. 2, or to detect possible scratching across the top of the semiconductor product, semiconductor product 18C as shown in FIG. 2, immediately below the top most semiconductor product, semiconductor product 18B as shown in FIG. 2. Semiconductor products 18 may be placed in the wafer carrier 16 by a handling tool which steps up a predetermined amount for each shelf. If the handler is off by a small amount for each shelf, by the time the handler gets to place semiconductor product 18B on the top shelf of the wafer carrier 16, the amount the handler may be off is multiplied by the number of shelves so the maximum offset will be at the top shelf which is shelf 25 in the present wafer carrier 16. The semiconductor product 18B in wafer carrier 16 may then scrape the $25^{th}$ shelf or the top of the inside of the wafer carrier 16. Any debris from this scraping may fall on semiconductor product 18C below semiconductor product 18B. If the handler comes in with a negative offset it could come in low to pick up the top most semiconductor product, semiconductor product 18B, dragging material across the top of the semiconductor product in the second most top shelf, semiconductor product 18C.

It is noted that in FIGS. 2 to 6, four wafer carriers are in place at semiconductor processing tool 14 having four load ports. It is preferred that the process begin with a wafer carrier at each load port which in the case of FIGS. 2 to 6 means all four wafer carriers in place at the four load ports. However, at a minimum, there should be at least two wafer carriers in place so that one of the test semiconductor products 12 may be transported through the semiconductor processing tool 14 to a second wafer carrier while a semiconductor product 12 is retrieved from the first wafer carrier.

Referring now to FIG. 3, the door (not shown) of wafer carrier 16 is opened and conventional picking and placing tools (not shown) from the semiconductor processing tool 14 may move the semiconductor products 18 from wafer carrier 16 docked at LP1 through the semiconductor processing tool 14 to LP4 as indicated by arrow 22. The semiconductor products 18 in wafer carrier 16 are shown in phantom indicating that the semiconductor products 18 are no longer in wafer carrier 16. The movement from LP1 to LP4 through the semiconductor processing tool 14 gives the greatest range of "positive Y" motion within the semiconductor processing tool 14 and thus the greatest possibility for the detection of contaminants within the semiconductor processing tool 14.

Docked at LP4 is wafer carrier 20 which has been precleaned to substantially remove any contaminants. The door of wafer carrier 20 may then be opened to receive semiconductor products 18 through LP4. It is noted that the positions of semiconductor products 18A and 18B have been reversed. That is, semiconductor product 18A on the first shelf in wafer carrier 16 is now on the $25^{th}$ shelf of wafer carrier 20 while semiconductor product 18B on the $25^{th}$ shelf of wafer carrier 16 is now on the first shelf of wafer carrier 20. Semiconductor product 18C remains on a shelf between semiconductor products 18A, 18B, which for purposes of illustration and not limitation is the $24^{th}$ shelf.

It should be noted that each of the semiconductor products 18 have been numbered with their starting shelf position in wafer carrier 16 so as to keep track of the movements of the semiconductor products 18 as they are transported from wafer carrier 16 to wafer carrier 20 and then to other wafer carriers as explained hereafter.

Once the semiconductor products are within wafer carrier 20, the door (not shown) of wafer carrier 20 may be closed and wafer carrier 20 may be undocked from LP4.

In a further step in the preferred exemplary embodiment, wafer carrier 20 may be redocked with LP4.

To obtain the best advantage of the exemplary embodiments, it is most preferred that the semiconductor products be moved in the order of top semiconductor product, middle semiconductor product and then bottom semiconductor or bottom semiconductor product, middle semiconductor product and then top semiconductor product. For example, in the transporting of semiconductor products from wafer carrier 16 in FIG. 2 to wafer carrier 20 in FIG. 3, the semiconductor products 18 are preferably moved in the order of semiconductor products 18A, 18B, then 18C or alternatively, in the order of semiconductor products 18B, 18C, then 18A.

Figure 4:
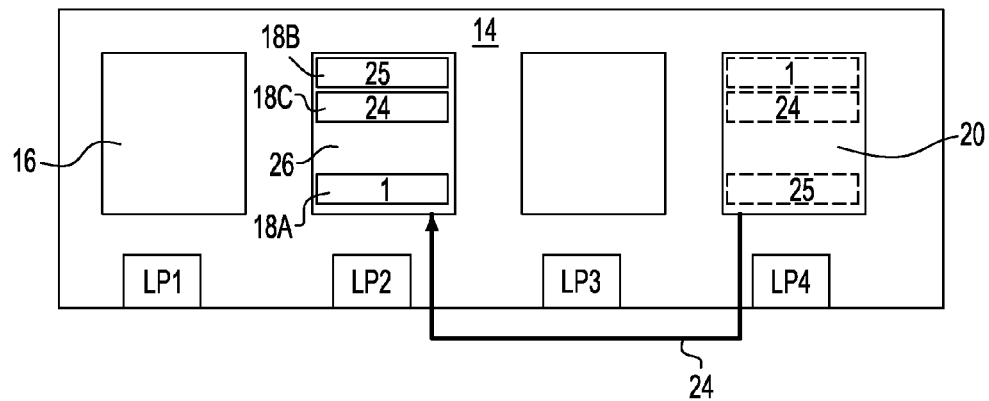

Referring now to FIG. 4, the door (not shown) of wafer carrier 20 is opened and conventional picking and placing tools (not shown) from the semiconductor processing tool 14 may move the semiconductor products 18 from wafer carrier 20 docked at LP4 through the semiconductor processing tool 14 to LP2 as indicated by arrow 24. The semiconductor products 18 in wafer carrier 20 are shown in phantom indicating that the semiconductor products 18 are no longer in wafer carrier 20. The movement from LP4 to LP2 through the semiconductor processing tool 14 gives the greatest range of "negative Y" motion within the semiconductor processing tool 14 and thus the greatest possibility for the detection of contaminants within the semiconductor processing tool 14.

For purposes of illustration and not limitation, Applicants have arbitrarily chosen movements to the right, such as from LP1 to LP4 to be "positive" motion movements in the Y direction while movements to the left, such as from LP4 to LP2 to be "negative" motion movements in the Y direction.

Docked at LP2 is wafer carrier 26 which has been precleaned to substantially remove any contaminants. The door of wafer carrier 26 may then be opened to receive semiconductor products 18. It is noted that the positions of semiconductor products 18A and 18B have been reversed again. That is, semiconductor product 18A on the 25th shelf in wafer carrier 20 is now on the first shelf of wafer carrier 26 while semiconductor product 18B on the first shelf of wafer carrier 20 is now on the 25th shelf of wafer carrier 26. Semiconductor product 18C remains on a shelf between semiconductor products 18A, 18B, which for purposes of illustration and not limitation is the $24^{th}$ shelf.

Once the semiconductor products are within wafer carrier 26, the door (not shown) of wafer carrier 26 may be closed and wafer carrier 26 may be undocked from LP2.

In a further step in the preferred exemplary embodiment, wafer carrier 26 may be redocked with LP2.

Figure 5:
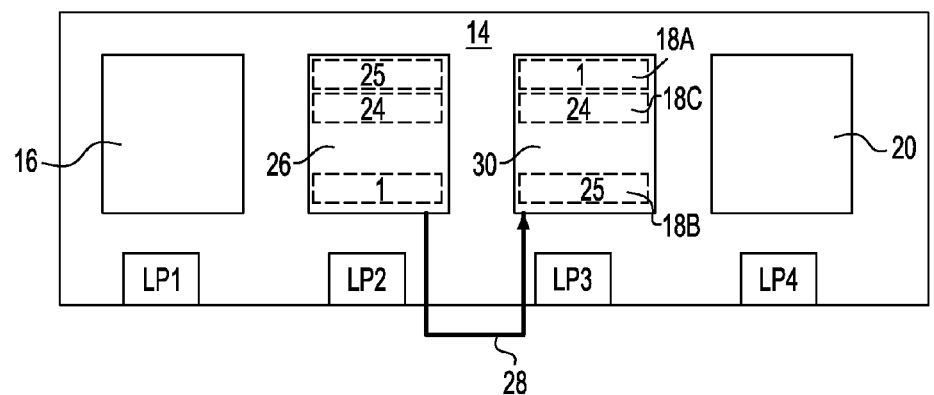

Referring now to FIG. 5, the door (not shown) of wafer carrier 26 is opened and conventional picking and placing tools (not shown) from the semiconductor processing tool 14 may move the semiconductor products 18 from wafer carrier 26 docked at LP2 through the semiconductor processing tool 14 to LP3 as indicated by arrow 28. The semiconductor products 18 in wafer carrier 26 are shown in phantom indicating that the semiconductor products 18 are no longer in wafer carrier 26. The movement from LP2 to LP3 through the semiconductor processing tool 14 gives the next greatest range of "positive Y" motion within the semiconductor processing tool 14 and thus the greatest possibility for the detection of contaminants within the semiconductor processing tool 14.

Docked at LP3 is wafer carrier 30 which has been precleaned to substantially remove any contaminants. The door of wafer carrier 30 may then be opened to receive semiconductor products 18. It is noted that the positions of semiconductor products 18A and 18B have been reversed again. That is, semiconductor product 18A on the first shelf in wafer carrier 26 is now on the 25th shelf of wafer carrier 30 while semiconductor product 18B on the 25th shelf of wafer carrier 26 is now on the first shelf of wafer carrier 30. Semiconductor product 18C remains on a shelf between semiconductor products 18A, 18B, which for purposes of illustration and not limitation is the $24^{th}$ shelf.

Once the semiconductor products are within wafer carrier 30, the door (not shown) of wafer carrier 30 may be closed and wafer carrier 30 may be undocked from LP3.

In a further step in the preferred exemplary embodiment, wafer carrier 30 may be redocked with LP3.

Figure 6:
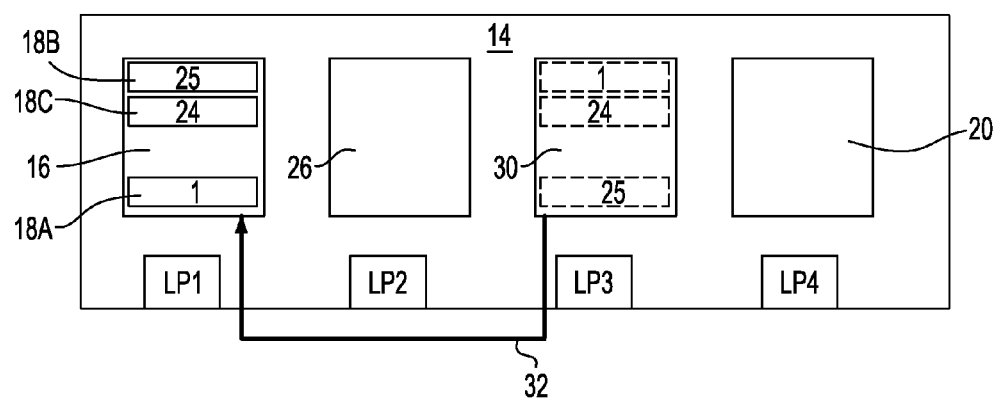

Referring now to FIG. 6, the door (not shown) of wafer carrier 30 is opened and conventional picking and placing tools (not shown) from the semiconductor processing tool 14 may move the semiconductor products 18 from wafer carrier 30 docked at LP3 through the semiconductor processing tool 14 to LP1 as indicated by arrow 32. The semiconductor products 18 in wafer carrier 30 are shown in phantom indicating that the semiconductor products 18 are no longer in wafer carrier 30. The movement from LP3 to LP1 through the semiconductor processing tool 14 gives the next greatest range of "negative Y" motion within the semiconductor processing tool 14 and thus the greatest possibility for the detection of contaminants within the semiconductor processing tool 14.

Docked at LP1 is wafer carrier 16 which was the first wafer carrier to be used in the exemplary embodiments. The door of wafer carrier 16 may then be opened to receive semiconductor products 18. It is noted that the positions of semiconductor products 18A and 18B have been reversed again. That is, semiconductor product 18A on the 25th shelf in wafer carrier 30 is now on the first shelf of wafer carrier 16 while semiconductor product 18B on the first shelf of wafer carrier 30 is now on the 25th shelf of wafer carrier 16. Semiconductor product 18C remains on a shelf between semiconductor products 18A, 18B, which for purposes of illustration and not limitation is the 24$^{th}$ shelf.

In the preferred exemplary embodiment, the semiconductor products 18 have been processed through all four load ports (LP1, LP2, LP3, LP4), all four wafer carriers (16, 20, 26, 30) and four times through the semiconductor processing tool 14.

Once the semiconductor products are within wafer carrier 16, the door (not shown) of wafer carrier 16 may be closed and wafer carrier 16 may be undocked from LP1 and transported to another tool to have the semiconductor products 18 scanned and the contaminants (including scratches) on the semiconductor products 18 measured. This measurement may be compared with the initial contamination measurement to result in the net contaminants added by the various movements into, out of and through the semiconductor processing tool 14.

It should be understood that the exemplary embodiments may be varied. For example, the semiconductor product 18A may be placed on a different lower shelf than the first shelf, the semiconductor product 18B may be placed on a different upper shelf other than the 25$^{th}$ shelf and the semiconductor product 18C may be placed on a different shelf between the semiconductor products 18A, 18B other than the 24$^{th}$ shelf. Further, the order of transporting the semiconductor products through the load ports may be varied from LP1-LP4-LP2-LP3-LP1 to something different such as LP1-LP2-LP3-LP4. The same wafer carrier may be used at all load ports instead of using a different wafer carrier at each load port. In addition, more than three semiconductor products may be used in each wafer carrier. While the preferred exemplary embodiment processes the semiconductor products 18 through all of the load ports, the method may be varied so that the semiconductor products 18 may be processed through less than all of the load ports.

It should be understood further that no processing of the semiconductor products that alters the semiconductor products may occur during the exemplary embodiments. That is, the semiconductors products may undergo a process such as mapping but this process does not alter the semiconductor products in any way other than possibly adding contaminants to the semiconductor products.

Figure 7:
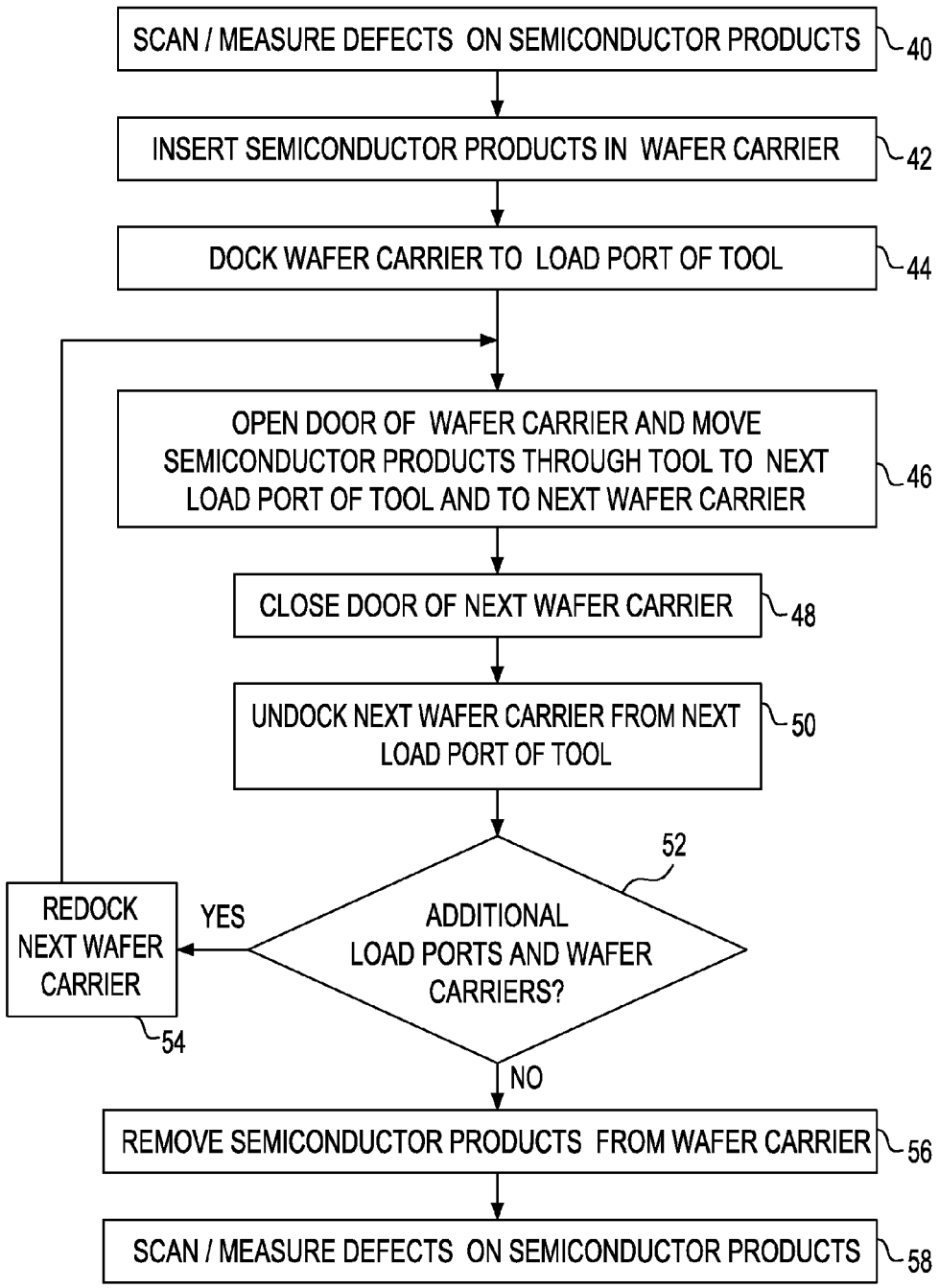
FIG. 7 is a flow chart for practicing the exemplary embodiments.

A flow chart of the exemplary embodiments is illustrated in FIG. 7. The process may begin by scanning semiconductor products, for example semiconductor wafers, for contaminants (including scratches) and then measuring the contaminants, box 40.

Then, the semiconductor products are inserted in a wafer carrier, either manually or by a product handler, box 42. The wafer carrier may be precleaned before insertion of the semiconductor products to substantially remove any contaminants in the wafer carrier.

The wafer carrier with the semiconductor products is docked at a first load port of a semiconductor processing tool, box 44.

The door of the wafer carrier is opened and the semiconductor products within the wafer carrier are moved through the semiconductor processing tool to a next load port of the semiconductor tool and into a next wafer carrier, box 46. As described previously, this next load port of the semiconductor processing tool preferably is the load port farthest away from the first load port although the process may be varied by moving to a different load port. It is preferred that the next wafer carrier be a different wafer carrier than the first wafer carrier but in other exemplary embodiments it could be the same wafer carrier. It is further preferred that the next wafer carrier be precleaned to substantially remove any contaminants.

The door of the next wafer carrier is closed, box 48, and the next wafer carrier is undocked from the next load port of the semiconductor processing tool, box 50.

The process continues to other load ports and wafer carriers, box 52. If there are other load ports that have not been tested, the process proceeds on the "yes" path to redock the next wafer carrier, box 54, and then return to open the door of the wafer carrier and move the semiconductor products through the semiconductor processing tool to the next port of the semiconductor processing tool and the next wafer carrier, box 46.

The process continues until there are no more load ports to be tested and, preferably, the semiconductor products have been transported back to the first wafer carrier. In this case, the process follows the "no" path.

The semiconductor products are removed from the wafer carrier, box 56, and then the semiconductor products are scanned for contaminants (including scratches) and the contaminants are measured. The measurement of the contaminants in this last step, box 58, are compared with the measurement of the contaminants in the first step, box 40, to determine the net contaminants resulting from the movement of the semiconductor products into, out of and through the semiconductor processing tool.

The exemplary embodiments may be performed manually or by computer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A process for detecting foreign particle defects and scratch defects on a plurality of semiconductor products comprising:
    detecting foreign particle and scratch defects on the plurality of semiconductor products;
    placing the plurality of semiconductor products in a first wafer carrier;
    docking the first wafer carrier to a first load port of a multi-port semiconductor processing tool;
    opening a door of the first wafer carrier;
    transferring the plurality of semiconductor products from the first wafer carrier through the first load port to an interior of the multi-port semiconductor processing tool;
    moving the semiconductor products through the interior of the multi-port processing tool without performing a processing operation on the semiconductor products that alters the semiconductor products to a second load port of the multi-port semiconductor processing tool;
    transferring the plurality of semiconductor products from the second load port to a second wafer carrier;
    closing a door of the second wafer carrier;
    undocking the second wafer carrier from the second load port; and
    detecting foreign particle and scratch defects on the semiconductor products and comparing to the foreign particle defects on the semiconductor products prior to placing the plurality of semiconductor products in the first wafer carrier.

2. The process of claim 1 wherein there are three semiconductor products and the process of placing the plurality of semiconductor products in the first wafer carrier includes placing one semiconductor product in a slot at a bottom of the first wafer carrier, placing one semiconductor product in a slot at a top of the first wafer carrier and placing one semiconductor product in a slot between the bottom of the first wafer carrier and the top of the first wafer carrier.

3. The process of claim 2 wherein the one semiconductor product at the bottom of the first wafer carrier is at the bottommost slot of the first wafer carrier, the one semiconductor product at the top of the first wafer carrier is at the topmost slot of the first wafer carrier and the one semiconductor product between the bottom of the first wafer carrier and the top of the first wafer carrier is at the slot that is the first slot below the topmost slot of the first wafer carrier.

4. The process of claim 2 wherein the process of transferring the plurality of semiconductor products from the second load port to the second wafer carrier includes transferring the one semiconductor product that was in the slot at the bottom of the first wafer carrier to a slot at a top of the second wafer carrier, transferring the one semiconductor product that was in the slot at the top of the first wafer carrier to a slot at a bottom of the second wafer carrier and transferring the one semiconductor product that was in the slot between the bottom of the first wafer carrier and the top of the first wafer carrier to a slot between the bottom of the second wafer carrier and the top of the second wafer carrier.

5. The process of claim 4 wherein the transferring the plurality of semiconductor products is in the order of transferring the one semiconductor product that was in the slot at the bottom of the first wafer carrier to a slot at a top of the second wafer carrier, transferring the one semiconductor product that was in the slot between the bottom of the first wafer carrier and the top of the first wafer carrier to a slot between the bottom of the second wafer carrier and the top of the second wafer carrier and transferring the one semiconductor product that was in the slot at the top of the first wafer carrier to a slot at a bottom of the second wafer carrier.

6. The process of claim 4 wherein the transferring the plurality of semiconductor products is in the order of transferring the one semiconductor product that was in the slot at the top of the first wafer carrier to a slot at a bottom of the second wafer carrier, transferring the one semiconductor product that was in the slot between the bottom of the first wafer carrier and the top of the first wafer carrier to a slot between the bottom of the second wafer carrier and the top of the second wafer carrier and transferring the one semiconductor product that was in the slot at the bottom of the first wafer carrier to a slot at a top of the second wafer carrier.

7. The process of claim 4 wherein the one semiconductor product at the bottom of the second wafer carrier is at the bottommost slot of the second wafer carrier, the one semiconductor product at the top of the second wafer carrier is at the topmost slot of the second wafer carrier and the one semiconductor product between the bottom of the second wafer carrier and the top of the second wafer carrier is at the slot that is the first slot below the topmost slot of the second wafer carrier.

8. The process of claim 1 wherein after undocking the second wafer carrier from the second load port and before detecting foreign particle defects, further comprising:
docking the second wafer carrier to the second load port;
opening the door of the second wafer carrier;
transferring the plurality of semiconductor products from the second wafer carrier through the second load port to the interior of the multi-port semiconductor processing tool;
moving the semiconductor products through the interior of the multi-port processing tool without performing a processing operation on the semiconductor products that alters the semiconductor products to a third load port of the multi-port semiconductor processing tool;
transferring the plurality of semiconductor products from the third load port to a third wafer carrier;
closing a door of the third wafer carrier;
undocking the third wafer carrier from the third load port;
docking the third wafer carrier to the third load port;
opening the door of the third wafer carrier;
transferring the plurality of semiconductor products from the third wafer carrier through the third load port to the interior of the multi-port semiconductor processing tool;
moving the semiconductor products through the interior of the multi-port processing tool without performing a processing operation on the semiconductor products that alters the semiconductor products to a fourth load port of the multi-port semiconductor processing tool;
transferring the plurality of semiconductor products from the fourth load port to a fourth wafer carrier;
closing a door of the fourth wafer carrier; and
undocking the fourth wafer carrier from the fourth load port.

9. The process of claim 8 wherein the process of transferring the plurality of semiconductor products from the third load port to the third wafer carrier includes transferring the one semiconductor product that was in the slot at the bottom of the second wafer carrier to a slot at a top of the third wafer carrier, transferring the one semiconductor product that was in the slot at the top of the second wafer carrier to a slot at a bottom of the third wafer carrier and transferring the one semiconductor product that was in the slot between the bottom of the second wafer carrier and the top of the second wafer carrier to a slot between the bottom of the third wafer carrier and the top of the third wafer carrier.

10. The process of claim 9 wherein the one semiconductor product at the bottom of the third wafer carrier is at the bottommost slot of the third wafer carrier, the one semiconductor product at the top of the third wafer carrier is at the topmost slot of the third wafer carrier and the one semiconductor product between the bottom of the third wafer carrier and the top of the third wafer carrier is at the slot that is the first slot below the topmost slot of the third wafer carrier.

11. The process of claim 9 wherein the process of transferring the plurality of semiconductor products from the fourth load port to the fourth wafer carrier includes transferring the one semiconductor product that was in the slot at the bottom of the third wafer carrier to a slot at a top of the fourth wafer carrier, transferring the one semiconductor product that was in the slot at the top of the third wafer carrier to a slot at a bottom of the fourth wafer carrier and transferring the one semiconductor product that was in the slot between the bottom of the third wafer carrier and the top of the third wafer carrier to a slot between the bottom of the fourth wafer carrier and the top of the fourth wafer carrier.

12. The process of claim 11 wherein the one semiconductor product at the bottom of the fourth wafer carrier is at the bottommost slot of the fourth wafer carrier, the one semiconductor product at the top of the fourth wafer carrier is at the topmost slot of the fourth wafer carrier and the one semiconductor product between the bottom of the fourth wafer carrier and the top of the fourth wafer carrier is at the slot that is the first slot below the topmost slot of the fourth wafer carrier.

13. The process of claim 1 wherein the multi-port semiconductor processing tool is a four load port tool with the four load ports being arranged in a row such that the first load port is at one end of the row and the second load port is at an opposite end of the row.

14. The process of claim 8 wherein the multi-port semiconductor processing tool is a four load port tool with the four load ports, LP1, LP2, LP3, LP4, being arranged in a row in the order of LP1, LP2, LP3, LP4 wherein the first load port through which the plurality of semiconductor products are transferred is LP1, the second load port through which the plurality of semiconductor products are transferred is LP4, the third load port through which the plurality of semiconductor products are transferred is LP2 and the fourth load port through which the plurality of semiconductor products are transferred is LP3.

15. A process for detecting foreign particle and scratch defects on a plurality of semiconductor products comprising:
 (a) detecting foreign particle and scratch defects on the plurality of semiconductor products;
 (b) transferring the plurality of semiconductor products to a wafer carrier;
 (c) docking the wafer carrier to a load port of a multi-port semiconductor processing tool;
 (d) opening a door of the wafer carrier;
 (e) transferring the plurality of semiconductor products from the wafer carrier through the load port to an interior of the multi-port semiconductor processing tool;
 (f) moving the semiconductor products through the interior of the multi-port processing tool without performing a processing operation on the semiconductor products that alters the semiconductor products to another load port of the multi-port semiconductor processing tool;
 (g) transferring the plurality of semiconductor products from the another load port to another wafer carrier;
 (h) closing a door of the another wafer carrier;
 (i) undocking the another wafer carrier from the another load port;
 (j) docking the another wafer carrier to the another load;
 (k) repeating the processes of (e) to (j) until the semiconductor products have been moved to any remaining load ports of the multi-port semiconductor processing tool and transferred to an remaining wafer carriers corresponding to the remaining load ports; and
 (l) detecting foreign particle and scratch defects on the semiconductor products and comparing to the foreign particle defects on the semiconductor products prior to placing the plurality of semiconductor products in the first wafer carrier.

16. The process of claim 15 wherein the multi-port semiconductor processing tool is a four load port tool.

17. A computer program product for detecting foreign particle and scratch defects on a plurality of semiconductor products, the computer program product comprising:
 a computer readable storage medium having computer readable program code embodied therewith, the computer readable program code comprising:
 (a) computer readable program code configured to detect foreign particle and scratch defects on the plurality of semiconductor products;
 (b) computer readable program code configured to transfer the plurality of semiconductor products to a wafer carrier;
 (c) computer readable program code configured to dock the wafer carrier to a load port of a multi-port semiconductor processing tool;
 (d) computer readable program code configured to open a door of the wafer carrier;
 (e) computer readable program code configured to transfer the plurality of semiconductor products from the wafer carrier through the load port to an interior of the multi-port semiconductor processing tool;
 (f) computer readable program code configured to move the semiconductor products through the interior of the multi-port processing tool without performing a processing operation on the semiconductor products that alters the semiconductor products to another load port of the multi-port semiconductor processing tool;
 (g) computer readable program code configured to transfer the plurality of semiconductor products from the another load port to another wafer carrier;
 (h) computer readable program code configured to close a door of the another wafer carrier;
 (i) computer readable program code configured to undock the another wafer carrier from the another load port;
 (j) computer readable program code configured to dock the another wafer carrier to the another load;
 (k) computer readable program code configured to repeat the processes of (e) to (j) until the semiconductor products have been moved to any remaining load ports of the multi-port semiconductor processing tool and transferred to an remaining wafer carriers corresponding to the remaining load ports; and
 (l) computer readable program code configured to detect foreign particle and scratch defects on the semiconductor products and compare to the foreign particle defects on the semiconductor products prior to placing the plurality of semiconductor products in the wafer carrier.

18. The computer program product of claim 17 wherein the multi-port semiconductor processing tool is a four load port tool.

* * * * *